(12) United States Patent
Weber et al.

(10) Patent No.: US 7,161,802 B2
(45) Date of Patent: Jan. 9, 2007

(54) THERMAL MANAGEMENT SYSTEM HAVING POROUS FLUID TRANSFER ELEMENT

(75) Inventors: Richard M. Weber, Prosper, TX (US); Kevin W. Chen, McKinney, TX (US)

(73) Assignee: Raytheon Company, Waltham, MA (US)

( * ) Notice: Subject to any disclaimer, the term of this patent is extended or adjusted under 35 U.S.C. 154(b) by 507 days.

(21) Appl. No.: 10/211,104

(22) Filed: Aug. 2, 2002

(65) Prior Publication Data

US 2004/0022027 A1 Feb. 5, 2004

(51) Int. Cl.
*H05K 7/20* (2006.01)

(52) U.S. Cl. ............... 361/699; 165/80.4; 165/104.33; 361/700

(58) Field of Classification Search ............... 165/80.2, 165/80.4, 185, 104.33, 104.34; 257/714–716; 361/698–702, 704–711, 717–722
See application file for complete search history.

(56) References Cited

U.S. PATENT DOCUMENTS

| | | | | |
|---|---|---|---|---|
| 4,047,198 A | | 9/1977 | Sekhon et al. ............... 357/82 |
| 4,233,645 A | * | 11/1980 | Balderes et al. ............ 361/699 |
| 4,770,238 A | | 9/1988 | Owen ..................... 165/104.26 |
| 4,833,567 A | * | 5/1989 | Saaski et al. ............... 361/700 |
| 5,046,365 A | * | 9/1991 | Kumley et al. ............. 361/700 |
| 5,790,376 A | | 8/1998 | Moore ........................ 361/700 |
| 6,453,537 B1 | * | 9/2002 | Hiem et al. ............ 165/104.33 |

FOREIGN PATENT DOCUMENTS

JP         2002303494         10/2002

OTHER PUBLICATIONS

PCT International Search Report in International Application No. PCT/US03/24329, dated Mar. 31, 2004, 7 pages.

\* cited by examiner

*Primary Examiner*—Gregory D Thompson
(74) *Attorney, Agent, or Firm*—Baker Botts L.L.P.

(57) ABSTRACT

A thermal management system is provided. The system has a thermal management apparatus which may be disposed adjacent to and connected with a heat source. The thermal management apparatus may include a body having a porous fluid transfer element disposed therein. The body may also have a heat transfer fluid disposed therein. The heat source may create relatively liquid-rich and liquid-poor regions within the thermal management apparatus. The wicking action of the porous fluid transfer element may be used to force heat transfer fluid from liquid-rich regions toward liquid-poor regions.

21 Claims, 2 Drawing Sheets

THERMAL MANAGEMENT SYSTEM HAVING POROUS FLUID TRANSFER ELEMENT

TECHNICAL FIELD OF THE INVENTION

The present invention relates generally to the field of managing and removing the waste heat produced by electronic devices and subassemblies.

BACKGROUND OF THE INVENTION

Electronic devices such as, for example, printed circuit boards (PCBs) generate heat due to the flow of electricity and the resistance thereto by components within the electronic device. The heat generated by the electronic device can diminish the performance and reliability of the electronic device. A conventional method of cooling higher heat level electronic devices is to couple the electronic device to a heat exchanger or cold wall which may be of the type shown in FIG. 1. Heat exchanger 80 includes a flow path 81 through which may flow a heat transfer fluid to absorb heat produced by an electronic device (not shown) which is coupled to heat exchanger 80. Heat exchanger 80 has an inlet 82 through which a heat transfer fluid is introduced into flow path 81 and an outlet 83 through which the heat transfer fluid exits flow path 81. As shown in the enlarged cross-sectional partial view 85, provided in FIG. 1, the flow path may comprise a plurality of channels 86 through which the heat transfer fluid flows.

For significantly higher heat loads a different type of heat transfer fluid or coolant may be required that absorbs heat by changing from a liquid to a vapor. These heat exchangers are sometimes referred to as two-phase cold walls. Referring to FIG. 1, with a two-phase cold wall the heat transfer fluid enters the heat exchanger 80 through inlet 82 as a liquid. After absorbing heat the heat transfer fluid becomes a vapor and exits the through outlet 83. Two phase heat exchangers are considerably more difficult to design for full performance due to the coexistence of liquid and vapor within the same flow passages. Also uneven distribution of the incoming liquid can result due to changing orientation or acceleration loading of the heat exchanger.

SUMMARY OF THE INVENTION

According to the present invention, disadvantages and problems associated with previous thermal management systems and techniques have been addressed.

According to an embodiment of the present invention, a thermal management system, is provided that includes a first heat source and a first thermal management apparatus coupled to the first heat source. The first thermal management apparatus includes a fluid transfer chamber. A heat transfer fluid is disposed within the fluid transfer chamber and a porous fluid transfer element is also disposed within the fluid transfer chamber. The porous fluid transfer element transfers a portion of the heat transfer fluid from a first position to a second position. The second position has a lower liquid density than the first position.

According to another embodiment of the present invention, a method of managing thermal dynamics of a heat source is provided and includes the step of providing a heat transfer fluid in a porous fluid transfer element adjacent the heat source. Then, the heat transfer fluid is wicked from a relatively liquid-rich area within the porous fluid transfer element toward a relatively liquid-poor area within the porous fluid transfer element.

According to another embodiment of the present invention, a thermal management system includes a heat source and a thermal management apparatus disposed adjacent the heat source. A heat transfer fluid is disposed within the thermal management apparatus. A porous fluid transfer element is disposed within the thermal management apparatus. The porous fluid transfer element transfers a portion of the heat transfer fluid from a first position to a second position.

According to another embodiment of the present invention, a thermal management apparatus includes a body having an interior, and a porous fluid transfer element disposed within the interior and adapted to transfer a portion of a heat transfer fluid within the interior from a liquid-rich area toward a liquid-poor area.

According to various aspects of some, none or all of the embodiments, the porous fluid transfer element may either passively or actively transfer heat transfer fluid. Also, heat transfer fluid which has transferred heat with the heat source may be periodically replaced, exhausted, or neither replaced nor exhausted, depending upon the application. Thus, the invention may encompass a one-use, or multi-use, apparatus or system.

Particular embodiments of the present invention may provide one, some, all, or none of certain technical advantages. For example, according to at least one embodiment, the wicking action of the porous fluid transfer element transfers heat transfer fluid from liquid-rich areas toward liquid-poor areas. This transfer may occur against the forces of gravity or other forces caused by movement of an apparatus or system incorporating the invention.

Other technical advantages, aspects and embodiments may be readily apparent to those skilled in the art from the following figures, descriptions, and claims.

BRIEF DESCRIPTION OF THE DRAWINGS

A better understanding of the present invention will be realized from the detailed description which follows, taken in conjunction with the accompanying drawings, in which.

DETAILED DESCRIPTION

Figure 1:
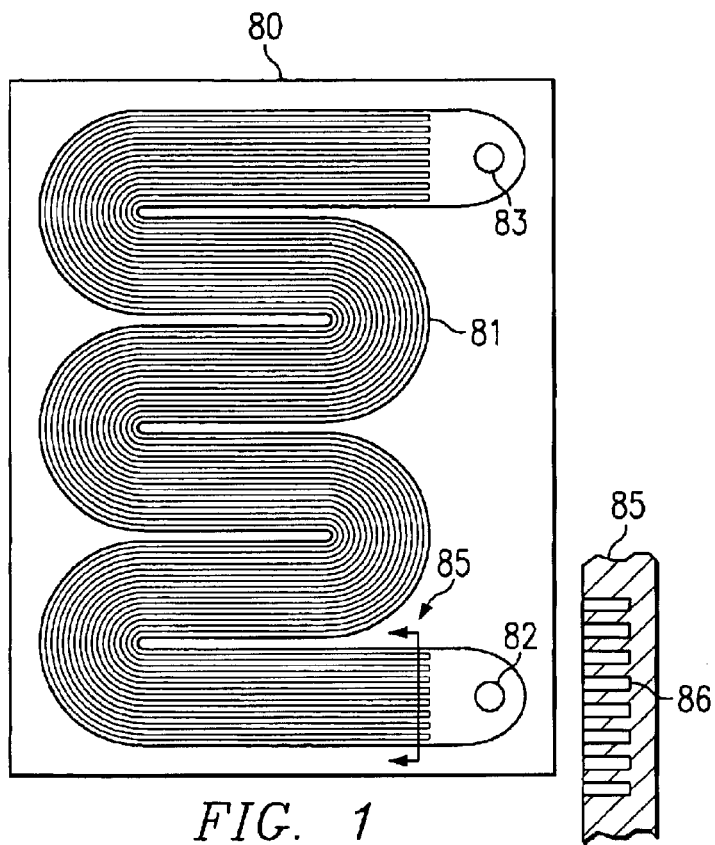
FIG. 1 is a conventional heat exchanger in accordance with the prior art.

A heat transfer apparatus used to remove heat from electronic devices, such as the cold wall shown in FIG. 1, has limitations on the amount of heat that can be removed where a heat transfer fluid enters and leaves the cold wall as a liquid. To be able to remove more heat a heat transfer fluid capable of boiling must be used. These types of cold walls and heat exchangers are referred to as two-phase cold walls and two-phase heat exchangers where the heat transfer fluid enters in the liquid phase and leaves in the vapor phase. Conventional two-phase cold walls are built somewhat similar to liquid-only phase cold walls. This approach has several drawbacks. One such drawback is the propensity of the liquid component of the heat transfer fluid to sink to the bottom of fluid flow passages within the heat exchanger. As a result, heated areas are not presented with liquid to absorb heat by changing from liquid to vapor. This condition is particularly troublesome near the outlet of the conventional two-phase heat exchanger because the heat transfer fluid has an even greater concentration of vapor in this area.

A result of these deficiencies is the creation of hot spots across the configuration of the electronic device. Another deficiency in conventional heat exchangers is that they are sensitive to gravity and acceleration induced forces which tend to cause the liquid component of the heat transfer fluid to be forced into certain areas of the heat exchanger, depending upon the orientation of the heat exchanger. For example, if the heat exchanger shown in FIG. 1 was positioned vertically such that the outlet was positioned above the inlet, gravity would tend to force the liquid component of the heat transfer fluid toward the bottom of the heat exchanger passages (i.e., toward the inlet), thereby exacerbating the problem of high vapor concentrations in hot spots near the outlet. External forces may be magnified in certain applications such as, for example, use of the heat exchanger in a high-performance military aircraft.

Among other things, various embodiments of the present invention are directed to systems that use a heat transfer fluid, which changes to vapor as heat is absorbed. Various embodiments also relate to other thermal management systems involving the exchange and transport of heat that use a heat transfer fluid, which changes from a liquid to a vapor as heat is absorbed and the heat is carried off by the vapor stream.

According to an embodiment of the present invention, a heat transfer apparatus, such as a cold wall, is provided that removes heat from a heat source such as an electronic circuit board. The apparatus includes a fluid transfer chamber. A heat transfer fluid is disposed within the fluid transfer chamber and a porous fluid transfer element is also disposed within the fluid transfer chamber. The porous fluid transfer element uses capillary action to enhance the distribution of coolant within the fluid transfer chamber. Using the capillary action of the porous fluid transfer element, the heat transfer fluid is wicked from relatively liquid-rich areas within the porous fluid transfer element toward relatively liquid-poor areas within the porous fluid transfer element.

With two-phase cold walls, as the heat transfer fluid nears the cold wall exit, it will have a significant portion of its flow in the vapor state and a lesser amount entrained as a liquid within the vapor stream. The vapor velocity will essentially propel the liquid portion past the heat transfer surfaces thus impeding the absorption of heat by the coolant. The porous fluid transfer element will capture the liquid portion and passively pump it to areas that are fluid-poor, using the capillary action supplied by the porous fluid transfer element. The capillary action of the porous fluid transfer element also assists in feeding the heat transfer fluid when a cold wall is subject to accelerations and adverse orientations.

Thus, capillary action may be used to enhance coolant flow during adverse orientations. This feature is useful for two-phase heat exchangers such as those in high-performance military aircraft, for example. The porous fluid transfer element will enhance two-phase heat exchanger performance by reducing the amount of area temporarily void of heat transfer fluid during a high-speed maneuver.

Among other things, an embodiment of the present invention is configured to reduce uneven heat exchange and the creation of hot spots, as well as the negative effects of gravity and other forces that affect the heat transfer performance of a two-phase heat exchanger. According to an embodiment of the present invention, a porous material may be incorporated into the heat exchanger to provide capillary action which draws the liquid component of a heat transfer fluid into liquid-poor areas of the heat exchanger against the forces of the vapor component and against the forces of gravity (and other forces caused by orientation and application of the heat exchanger). Suitable heat transfer fluids are fluorinerts, methanol, water, water and methanol mixtures, water and ethylene glycol mixtures, and ammonia.

Figure 2:
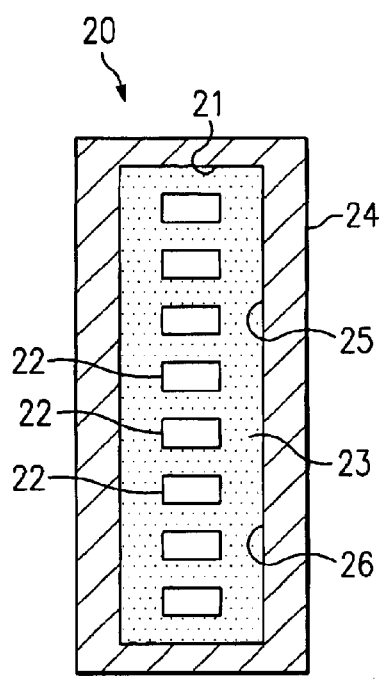
FIG. 2 is a cross-sectional view of a heat transfer apparatus having a porous fluid transfer element in accordance with an embodiment of the present invention.

FIG. 2, according to an embodiment of the present invention, shows the flow path 21 of a heat transfer apparatus 20. Heat transfer apparatus 20 may be, for example, a two-phase cold wall. Apparatus 20 is lined with a porous material 23 where heat is inputted into surfaces 24. The heat transfer fluid flows through channels 22 and converts to vapor as heat is absorbed. As the heat transfer fluid mass flow picks up more heat as it moves towards the cold wall exit (not expressly shown), a greater proportion of its mass flow is in the vapor state and less in the liquid state. As a result, the velocity of the vapor component essentially propels the liquid component past the heat transfer surfaces, thus impeding the absorption of heat by the heat transfer fluid. Porous fluid transfer element 23 captures the liquid portion and passively pumps it to areas that are fluid-poor using the capillary action supplied by the porous fluid transfer element 23. Porous heat transfer element 23 transports the liquid to the internal side 25 of heated surfaces 24. Porous fluid transfer element 23 also functions as a fin stock that increases the area from which heat is absorbed. Enclosure 26 can comprise any suitable material such as, for example, aluminum. Other types of materials that may be used include copper, aluminum silicon carbide, and composite materials.

The porous material of element 23 may include any suitable material capable of providing capillary action for the heat transfer fluid selected for use within the thermal management apparatus. Preferably, the porous material is a microporous material made of microporous aluminum, bronze, copper, and composite felts.

Figure 3:
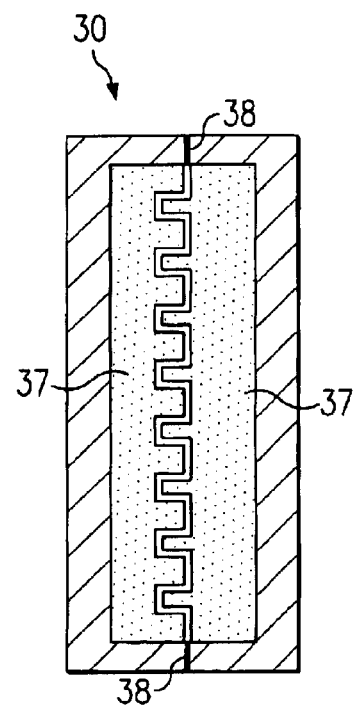
FIG. 3 is a cross-sectional view of a heat transfer apparatus having a porous fluid transfer element in accordance with an embodiment of the present invention.

FIG. 3 depicts a cross-section of the flow path of a heat transfer apparatus 30, which may be a two-phase cold wall generally similar to that shown in FIG. 2. In this embodiment, the apparatus is assembled from interlocking portions joined along a surface 38. Among other things, this approach offers an alternative that aids in assembly with an alternative method of construction of the porous fluid transfer element 37.

Figure 4:
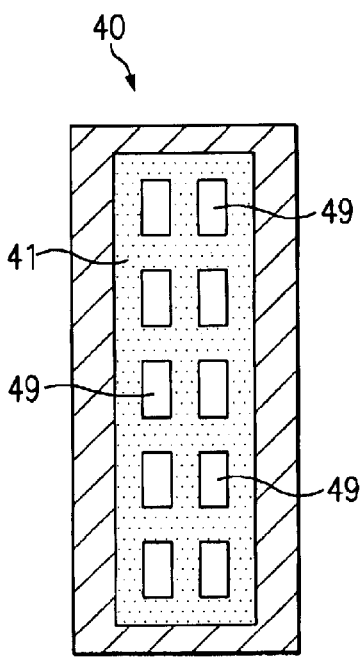
FIG. 4 is a cross-sectional view of a heat transfer apparatus having a porous fluid transfer element in accordance with an embodiment of the present invention.

FIG. 4 depicts a cross-section of the flow path of a heat transfer apparatus 40, which may be a two-phase cold wall generally similar to that shown in FIGS. 2 and 3. In this embodiment, the porous fluid transfer element 41 has an increased number of channels 49 through which the heat transfer fluid flows. This embodiment offers an alternative that will allow for less restriction of the heat transfer fluid mass flow while providing more area though which the liquid component of the heat transfer fluid can transported by the capillary action of the porous heat transfer element 41.

Figure 5:
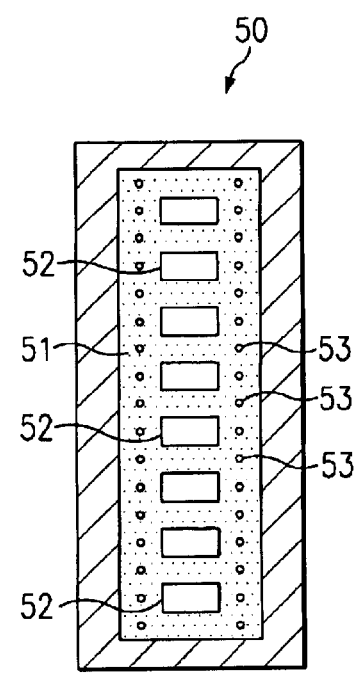
FIG. 5 is a cross-sectional view of a heat transfer apparatus having a porous fluid transfer element in accordance with an embodiment of the present invention.

FIG. 5 depicts a cross-section of the flow path of a heat transfer apparatus 50, which may be a two-phase cold wall generally similar to that shown in FIGS. 2, 3, and 4. In this embodiment, the porous fluid transfer element 51 has additional channels 53 removed from the main channels 52. Channels 53 provide additional paths through which vapor can exit the porous fluid transfer element 51. This enhances the capillary action of porous fluid transfer element 51 by minimizing the coexistence of liquid and vapor in porous fluid transfer element 51.

Thus, main channels 52 comprise a first group of fluid transfer channels and additional channels 53 comprise a second group of fluid transfer channels. According to certain applications, the first group of fluid transfer channels (channels 52) provides passage for the transport of both liquid and vapor components of a heat transfer fluid, while the second group of fluid transfer channels (channels 53) provides passage for the transport of substantially only the vapor component of the heat transfer fluid.

Figure 6:
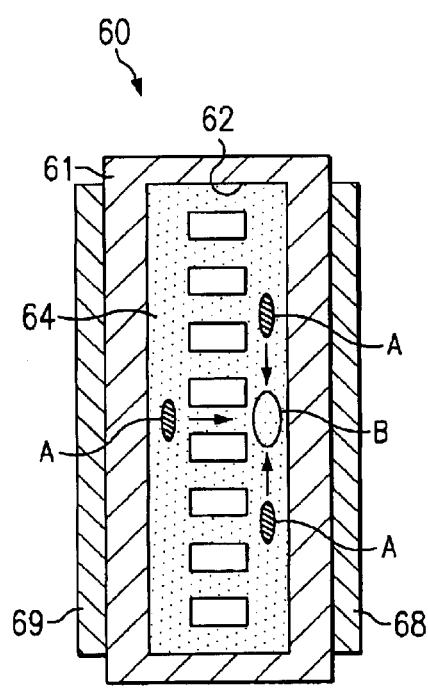
FIG. 6 is a cross-sectional view of a heat transfer system in accordance with an embodiment of the present invention.

FIG. 6 depicts a thermal management system 60 which comprises certain basic elements previously depicted and described. Thus, thermal management system 60 includes a thermal management apparatus 61, having a fluid transfer chamber 62, and a fluid transfer element 64 disposed within fluid transfer chamber 62, and a heat transfer fluid disposed within fluid transfer chamber 62. A heat transfer fluid preferably fills the voids within the porous material that comprises fluid transfer element 64. Additionally, thermal management system 60 comprises a first heat source 68 and a second heat source 69. The heat sources 68 and 69 may include any heat-producing element such as an electronic device. As previously discussed, the creation of hot spots by the heat sources may result in a liquid-poor area (such as area B). However, the capillary action of the porous material of fluid transfer element 64 tends to force the liquid component of the heat transfer fluid from liquid-rich areas A into the liquid-poor area B.

According to another embodiment, a system may include multiple thermal management sub-systems, which may be arranged, for example, in a stack. Each thermal management sub-system may include a thermal management apparatus and at least one heat source. The thermal management apparatus heat source may be any of the configurations discussed herein in connection with other various figures. Additionally, the fluid transfer chambers may be linked to one another through one or more linking channels.

The configurations of the heat transfer devices described and depicted herein are provided by way of example only, and may be modified within the scope of the present invention. For instance, the channels and porous fluid transfer element can be provided in any of a variety of configurations.

Channels have been shown in certain figures as having a rectangular cross-section. However, the cross-sectional shape of the channels, for this or any other configuration herein, may be varied depending upon the desired application. Also, in certain figures, channels have been depicted as having a longitudinal axis that is parallel with the plane defined by the thermal management apparatus. However, the longitudinal axis of a channel may extend in a direction different from other channels and non-parallel to the plane of the respective thermal management apparatus. Additionally, the axis of any given channel may change direction along a flow path of the respective channel.

The thermal management apparatus of any of the configurations discussed herein may be self-contained in that the apparatus is pre-loaded with the heat transfer fluid. A vent (not shown) may be provided to allow a portion of the heat transfer fluid to exit the thermal management apparatus. A self-contained configuration, or a configuration with a vent, may be used, for example, in single-use applications. In a single-use application, the heat transfer capacity of the apparatus is preferably used a single time, either partially or completely, after which the spent apparatus is disposable.

Also, a thermal management apparatus may be provided with an inlet and an outlet, such that heat transfer fluid may be continuously pumped into the fluid transfer chamber, and heat transfer fluid that has already exchanged heat with a heat source may exit fluid transfer chamber. According to this configuration, the apparatus is preferably reusable for multiple instances of a single application, or for multiple applications.

Although specific examples of the invention and its advantages have been described above in detail, a person of ordinary skill in the art could make various alterations, additions, and omissions without departing from the spirit and scope of the present invention as defined by the appended claims.

What is claimed is:

1. A thermal management system, comprising:
a first heat source;
a first thermal management apparatus coupled to the first heat source, the first thermal management apparatus comprising a fluid transfer chamber, the first heat source external to the fluid transfer chamber;
a heat transfer fluid disposed within the fluid transfer chamber; and
a porous fluid transfer element disposed within the fluid transfer chamber, the porous fluid transfer element transferring a portion of the heat transfer fluid from a first position to a second position, the second position having a lower liquid density than the first position.

2. The thermal management system of claim 1, wherein the thermal management apparatus comprises a thermal plane.

3. The thermal management system of claim 1, wherein the porous fluid transfer element passively transfers a portion of the heat transfer fluid from the first position to the second position.

4. The thermal management system of claim 1, wherein the porous fluid transfer element comprises a microporous material.

5. The thermal management system of claim 1, wherein the porous fluid transfer element partially fills the fluid transfer chamber.

6. The thermal management system of claim 1, wherein the porous fluid transfer element substantially fills the fluid transfer chamber.

7. The thermal management system of claim 1, wherein the fluid transfer chamber has a first portion and a second portion, the first portion being filled with the porous fluid transfer element, the second portion comprising at least one first channel within the porous fluid transfer element operable to transfer the heat transfer fluid in liquid and vapor phases.

8. The thermal management system of claim 7, wherein the fluid transfer chamber has a third portion, the third portion comprising at least one second channel operable to transfer the heat transfer fluid in a substantially non-liquid phase.

9. The thermal management system of claim 1, wherein the porous fluid transfer element has formed therein a plurality of discrete fluid transfer channels, each of said plurality of discrete fluid transfer channels being devoid of the porous fluid transfer element.

10. The thermal management system of claim 1, wherein the fluid transfer element has formed therein at least one first fluid transfer channel transferring the heat transfer fluid in liquid and vapor phases, and at least one second fluid transfer channel transferring the heat transfer fluid in a substantially non-liquid phase.

11. The thermal management system of claim 1, further comprising a second heat source, the fluid transfer chamber being disposed between the first and second heat sources.

12. The thermal management system of claim 11, further comprising a second thermal management apparatus coupled to the second heat source.

13. The thermal management system of claim 1, wherein the porous fluid transfer element has formed therein at least one fluid transfer channel extending in a direction that is non-parallel to a plane defined by the first thermal management apparatus.

14. The thermal management system of claim 11, wherein the at least one fluid transfer channel extends in a direction substantially normal to the plane defined by the first thermal management apparatus.

15. The thermal management system of claim 1, wherein the porous fluid transfer element has formed therein at least one fluid transfer channel extending in a direction substantially parallel to a plane defined by the first thermal management apparatus.

16. The thermal management system of claim 1, further comprising a vent communicating an interior with an exterior of the fluid transfer chamber.

17. The thermal management system of claim 1, further comprising an inlet for introducing the heat transfer fluid into the fluid transfer chamber, and an outlet for exhausting the heat transfer fluid from the fluid transfer chamber.

18. A thermal management system comprising:

a heat source;

a thermal management apparatus having a chamber, the heat source disposed adjacent to the thermal apparatus and external to the chamber;

a heat transfer fluid disposed within the thermal management apparatus; and a porous fluid transfer element disposed within the thermal management apparatus, the porous fluid transfer element transferring a portion of the heat transfer fluid from a first position to a second position, the first position comprising at least one channel formed within the porous fluid transfer element.

19. The thermal management system of claim 18, wherein the porous fluid transfer element transfers a portion of the heat transfer fluid from a liquid-rich area toward a liquid-poor area, the liquid-rich area having a higher fluid density than the liquid-poor area.

20. The thermal management system of claim 18, wherein the heat transfer fluid is not replaced during use.

21. The thermal management system of claim 18, wherein at least a portion of the heat transfer fluid is replaced during use.

* * * * *